United States Patent
Park et al.

(10) Patent No.: US 9,560,775 B2
(45) Date of Patent: Jan. 31, 2017

(54) CURVED DISPLAY APPARATUS

(71) Applicant: SAMSUNG ELECTRONICS CO., LTD., Suwon-si (KR)

(72) Inventors: Doo Soon Park, Yongin-si (KR); Bo La Park, Yangju-si (KR); Hae Sung Park, Seoul (KR); Sung Il Bang, Seoul (KR); Jun Young Choi, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 115 days.

(21) Appl. No.: 14/289,868

(22) Filed: May 29, 2014

(65) Prior Publication Data

US 2014/0355805 A1 Dec. 4, 2014

Related U.S. Application Data

(60) Provisional application No. 61/828,250, filed on May 29, 2013.

(30) Foreign Application Priority Data

Jun. 21, 2013 (KR) ........................ 10-2013-0071615

(51) Int. Cl.
*H05K 5/00* (2006.01)
*H04R 1/02* (2006.01)
(Continued)

(52) U.S. Cl.
CPC .............. *H05K 5/0017* (2013.01); *H04N 5/64* (2013.01); *H04R 1/028* (2013.01); *H05K 5/0234* (2013.01); *G02F 2001/133328* (2013.01)

(58) Field of Classification Search
CPC ........ H04N 5/64; H04R 1/028; H05K 5/0017; H05K 5/0234; G02F 2001/133328
(Continued)

(56) References Cited

U.S. PATENT DOCUMENTS 7,627,969 B2 12/2009 Ericson
2002/0096979 A1 7/2002 Johnson
(Continued)

FOREIGN PATENT DOCUMENTS

CN 201042051 Y 3/2008
CN 102109081 A 6/2011
(Continued)

OTHER PUBLICATIONS

Communication dated Sep. 30, 2015 issued by the Russian Patent Office in counterpart Russian Patent Application No. 2014121729/07.
(Continued)

*Primary Examiner* — Anthony Haughton
*Assistant Examiner* — Yahya Ahmad
(74) *Attorney, Agent, or Firm* — Sughrue Mion, PLLC

(57) ABSTRACT

A display apparatus is provided. The display apparatus includes a display which is curved such that opposite lateral ends thereof protrude forward relative to a central portion thereof. A support frame having a lower end supported on a horizontal surface and allowing the display to be disposed inside thereof is provided; wherein the support frame is curved such that opposite lateral ends thereof protrude forward relative to the central portion thereof.

19 Claims, 12 Drawing Sheets

(51) Int. Cl.
*H05K 5/02* (2006.01)
*H04N 5/64* (2006.01)
*G02F 1/1333* (2006.01)

(58) Field of Classification Search
USPC ........... 361/679.01, 679.21, 679.3, 752, 807; 349/58, 65; 381/333
See application file for complete search history.

(56) References Cited

U.S. PATENT DOCUMENTS

| | | | |
|---|---|---|---|
| 2003/0223188 A1 | 12/2003 | Ha et al. | |
| 2005/0110911 A1 | 5/2005 | Childrey et al. | |
| 2005/0239037 A1 | 10/2005 | Lertsithichai et al. | |
| 2005/0264689 A1 | 12/2005 | Yang et al. | |
| 2007/0127215 A1* | 6/2007 | Jeong | H05K 7/20963 361/710 |
| 2007/0146569 A1* | 6/2007 | Nouchi | G02B 6/0088 349/58 |
| 2008/0230671 A1 | 9/2008 | Xing | |
| 2010/0053912 A1 | 3/2010 | Harita | |
| 2010/0079942 A1* | 4/2010 | Yamamoto | G02F 1/133308 361/690 |
| 2011/0260960 A1 | 10/2011 | Jean et al. | |
| 2012/0020056 A1 | 1/2012 | Yamagata et al. | |
| 2012/0033375 A1 | 2/2012 | Madonna et al. | |
| 2012/0081874 A1 | 4/2012 | Wu et al. | |
| 2012/0262907 A1 | 10/2012 | Lee et al. | |
| 2012/0281367 A1 | 11/2012 | He et al. | |
| 2013/0155655 A1* | 6/2013 | Lee | H05K 5/03 362/97.1 |
| 2013/0329162 A1* | 12/2013 | Fujii | H05K 7/14 349/58 |

FOREIGN PATENT DOCUMENTS

| | | |
|---|---|---|
| CN | 102436780 A | 5/2012 |
| DE | 20 2013 100638 U1 | 3/2013 |
| GB | 2 481 854 A | 1/2012 |
| JP | 2008-309813 A | 12/2008 |
| KR | 100278841 B1 | 1/1994 |
| KR | 10-0435826 B1 | 8/2004 |
| RU | 2008104789 A | 8/2009 |
| RU | 2008120460 A | 11/2009 |
| RU | 2426938 C1 | 8/2011 |
| RU | 2011 119 641 A | 11/2012 |
| RU | 2011 134 845 A | 2/2013 |
| WO | 2011/071455 A1 | 6/2011 |

OTHER PUBLICATIONS

Communication dated Jan. 23, 2015 issued by Australian Intellectual Property Office in counterpart Australian Patent Application No. 2014202903.
Communication dated Jan. 12, 2015 issued by Russian Intellectual Property Office in counterpart Russian Application No. 2014121729/07.
XP 55132010 A / TomTom ONE XL; Nov. 19, 2008; pp. 58 total.
Communication dated Aug. 5, 2014, issued by the European Patent Office in counterpart European Application No. 14170230.8.
Communication issued Apr. 5, 2016, issued by the Australian Patent Office in counterpart Australian Patent Application No. 2013204014.
Communication issued May 12, 2016, issued by the European Patent Office in counterpart European Patent Application No. 14150280.7.
Communication issued Apr. 22, 2016, issued by the Federal Service for Intellectual Property in counterpart Russian Patent Application No. 2013157508.
Request for correction dated May 30, 2016, issued to the Federal Service for Intellectual Property in counterpart Russian Patent Application No. 2013157508.
Communication issued Jun. 3, 2016, issued by the Federal Service for Intellectual Property in counterpart Russian Patent Application No. 2013157508.
Communication dated Jun. 27, 2016, issued by the Korean Patent Office in counterpart Korean Application No. 10-2015-0011165.
Communication dated Jun. 20, 2016, issued by the European Patent Office in counterpart European Application No. 14170230.8.
Communication dated Mar. 6, 2015 issued by the Australian Patent Office in counterpart Australian Patent Application No. 2013204014.
Communication dated Mar. 26, 2015 issued by the Canadian Intellectual Property Office in counterpart Canadian Patent Application No. 2,837,945.
Communication dated Apr. 22, 2015 issued by the Russian Patent Office in counterpart Russian Patent Application No. 2013157508.
Communication dated Apr. 1, 2015, issued by the French Patent Office in counterpart French Application No. 1363711.
Communication dated Nov. 28, 2016, issued by the Korean Intellectual Property Office in counterpart Korean Application No. 10-2015-0011165.

* cited by examiner

CURVED DISPLAY APPARATUS

CROSS-REFERENCE TO RELATED APPLICATIONS

This application claims the benefit of U.S. Patent Application No. 61/828,250, filed on May 29, 2013 in United States Patent and Trademark Office, and Korean Patent Application No. 2013-0071615, filed on Jun. 21, 2013 in the Korean Intellectual Property Office, the disclosures of which is incorporated herein by reference, in their entireties.

BACKGROUND

1. Technical Field

Apparatuses of the exemplary embodiments relate to a curved display apparatus having a display with both lateral ends protruding forward.

2. Description of the Related Art

A display apparatus is a device that generally receives image signals and displays images. Examples of the display apparatus may include a television and a monitor.

Recently, a display apparatus having a display formed in a curved shape with both lateral ends protruding forward, relative to the central portion of the display, to make two-dimensional images look three-dimensional, to some extent, has been proposed.

SUMMARY

An aspect of the exemplary embodiments provide a curved display apparatus having a support structure suitable for a display which is curved, such that both lateral ends thereof of the curved display protrude forward relative to the central portion of the display.

Additional aspects of the exemplary embodiments will be set forth in part in the description which follows and, in part, will be obvious from the description, or may be learned by practice of the exemplary embodiments.

In accordance with one aspect of the exemplary embodiments, a display apparatus includes a display curved such that opposite lateral sides thereof protrude forward, and a support frame having a lower end supported on a horizontal surface and allowing the display to be disposed inside thereof, wherein opposite lateral sides of the support frame protrude forward such that the support frame is curved to correspond to the display.

The support frame may be formed in a shape of a quadrangular ring.

The support frame may have a curvature equal to a curvature of a rear surface of the display.

A front surface of the display may have a smaller curvature than a curvature of the rear surface of the display.

The support frame may include an upper frame and a lower frame spaced apart from each other in a vertical direction and extending in a horizontal direction, and a pair of side frames extending in the vertical direction to connect both lateral ends of the upper frame to both lateral ends of the lower frame, wherein each of the upper frame and the lower frame may be curved such that the lateral ends thereof protrude forward relative to a central portion thereof.

The display apparatus may further include a camera allowing use of a video call.

The camera may be installed at the support frame.

The support frame includes a pair of main speakers disposed at both sides of the support frame.

The main speakers may be disposed at opposite sides of the lower frame.

The display apparatus may further include a leg installed at least at one of the display and the support frame to allow the display and the support frame to remain standing.

The display and the support frame may be installed at an incline such that an upper end of each of the display and the support frame is rearwardly inclined.

The display may include a display panel and a bottom chassis, the bottom chassis is curved such that both lateral ends thereof protrude relative to a central portion thereof to support a rear surface of the display panel, wherein the display panel may be attached to the bottom chassis and deformed to be curved in a shape which corresponds to the bottom chassis.

The display panel may include an organic light emitting diode panel.

The display may further include a reinforcement member disposed at the bottom chassis to enhance the strength of the bottom chassis.

The reinforcement member may be disposed on a front surface of the bottom chassis, wherein a heat dissipation sheet allowing heat to be easily distributed and an insulation sheet formed of an insulation material may be disposed, between the display panel and the reinforcement member.

The display may have a thickness which gradually decreases from a central portion of the display to both lateral ends of the display.

The display may include the bottom chassis curved such that the both lateral ends thereof protrude relative to the central portion, and at least one printed circuit board disposed on a rear surface of the bottom chassis, wherein the bottom chassis may include a plurality of studs allowing the at least one printed circuit board to be installed at and spaced apart from the rear surface of the bottom chassis.

The plurality of studs may have a height which gradually decreases from a central portion of the bottom chassis to both lateral ends of the bottom chassis.

The display may further include a sub-speaker installed on a rear surface of the bottom chassis, wherein a thickness of the sub-speaker may gradually decrease as the sub-speaker extends from a point close to a central portion of the bottom chassis to a point close to a lateral end of the bottom chassis.

The display may include a display panel to display images, a bottom chassis curved such that both lateral ends thereof protrude forward, and at least one printed circuit board installed at the bottom chassis, wherein the at least one printed circuit board may include a power board configured to supply power, a panel drive board configured to transfer the power to the display panel, a timing control board configured to transfer an image signal to the display panel, and a signal processing board configured to process image signals and sound signals.

The power board may be divided into two parts and installed at the bottom chassis.

The power board may be disposed at a center of the bottom chassis, the panel drive board may be disposed at a center of an upper portion of the bottom chassis, the timing control board may be disposed at one side of a lower portion of the bottom chassis, and the signal processing board may be disposed at the other side of the lower portion of the bottom chassis.

The display may include a side surface case which defines four side surfaces of the display at upper, lower, left and right sides of the display and a rear surface case defining a rear surface of the display.

The side surface case may include a first side surface case formed in an upside down U-shape and a second side surface case formed of a resin material and connecting lower ends of the first side surface case.

At least one of a Wi-Fi module allowing the display apparatus to be wirelessly connected to Internet and a Bluetooth® module allowing the display apparatus to be connected to an external device through Bluetooth may be disposed at a lower portion of the display.

The rear surface may include a rear surface plate formed of a metallic material and a support plate attached to a front surface of the rear surface plate in order to support the rear surface plate.

The rear surface case may include an aluminum sheet attached to the rear surface of the rear surface plate.

The may further include a pair of connection frames to connect the display to the support frame.

The pair of connection frames may include an upper connection frame having an upper end fixed to a central portion of the upper frame and a lower end connected to a center of an upper end of the display, and a lower connection frame having an upper end connected to a center of a lower end of the display and a lower end connected to a central portion of the lower frame.

An aspect of an exemplary embodiment may provide a display apparatus including: a curved display including opposite lateral sides which forwardly protrude; and a curved support frame having a lower end supported on a horizontal surface and disposing the curved display therein, wherein opposite lateral sides of the curved support frame protrude forwardly in order to correspond to the shape of the display.

BRIEF DESCRIPTION OF THE DRAWINGS

These and/or other aspects will become apparent and more readily appreciated from the following description of the exemplary embodiments, taken in conjunction with the accompanying drawings of which.

DETAILED DESCRIPTION OF THE EXEMPLARY EMBODIMENTS

Figure 1:
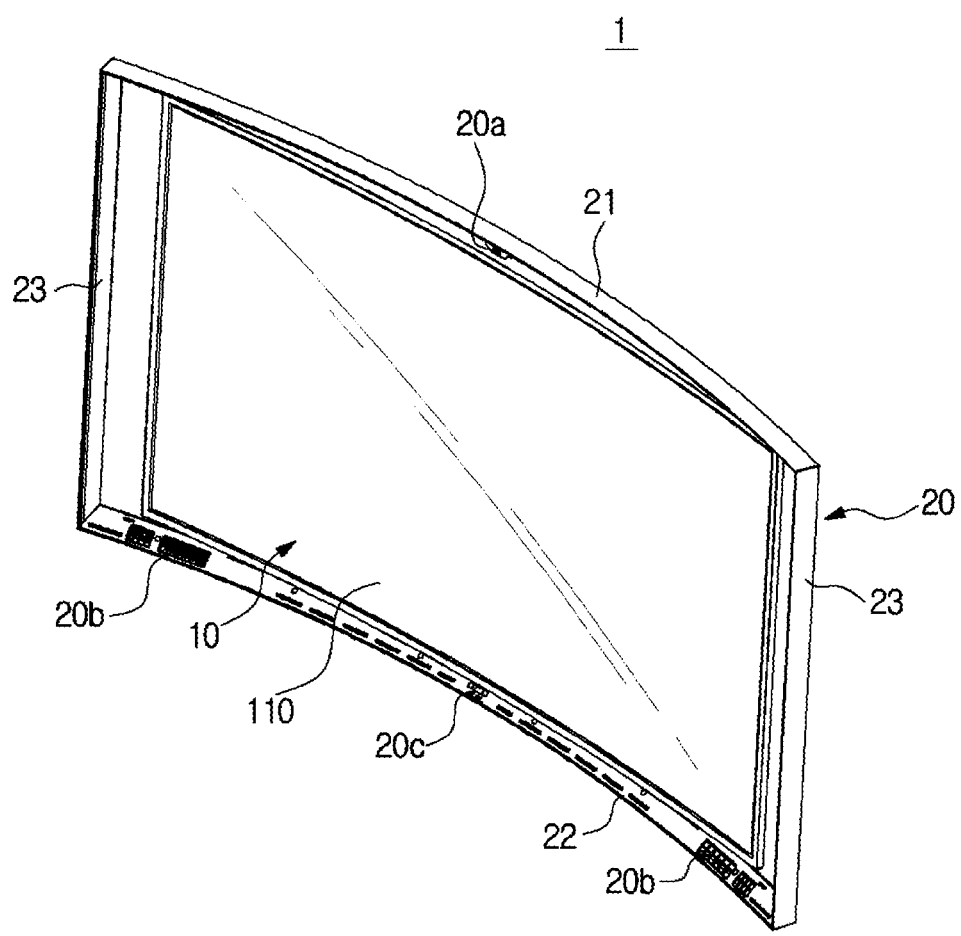
FIG. 1 is a front perspective view which illustrates a display apparatus according to an exemplary embodiment.

Reference will now be made in detail to the exemplary embodiments, examples of which are illustrated in the accompanying drawings, wherein like reference numerals refer to like elements throughout.

Figure 2:
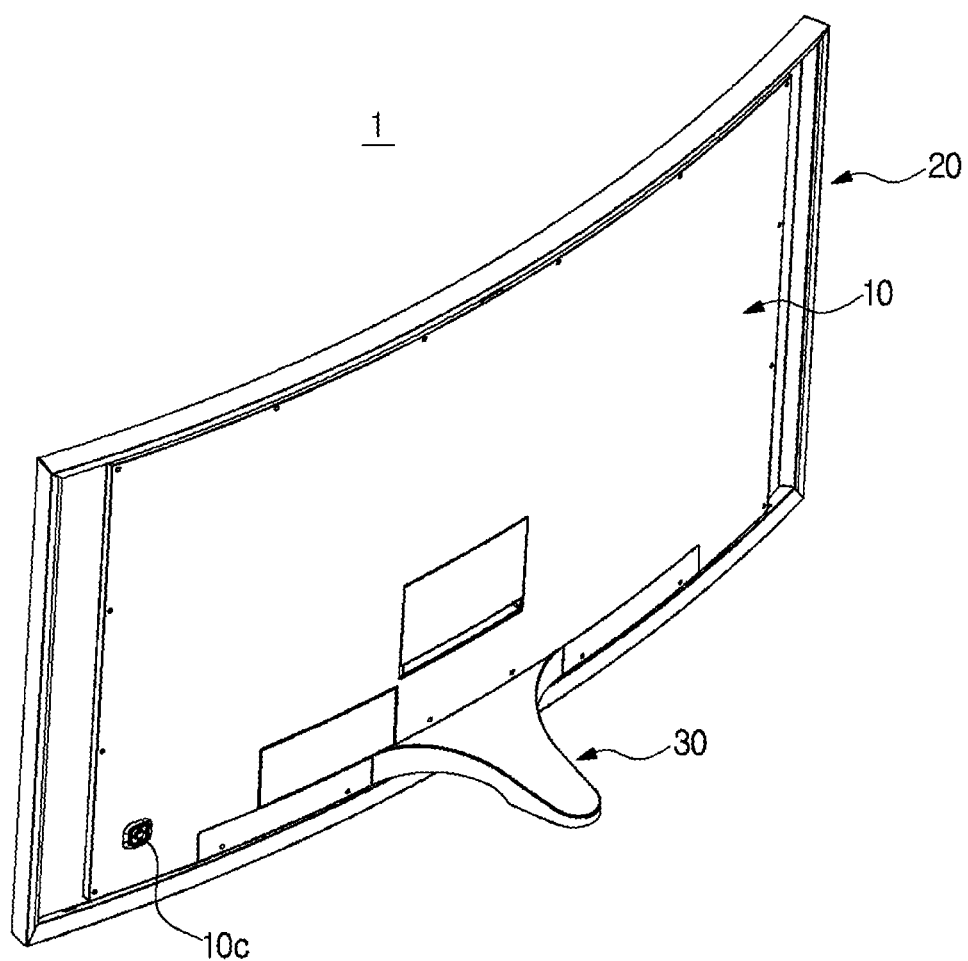
FIG. 2 is a rear perspective view which illustrates a display apparatus according to an exemplary embodiment.

As shown in FIGS. 1 and 2, a display apparatus 1 according to one exemplary embodiment includes a display 10 to display images, a support frame 20 having a lower end supported on a horizontal surface and adapted to support the display 10 installed therein, and a leg 30 allowing the display 10 and the support frame 20 to remain stably standing on the horizontal surface.

Figure 3:
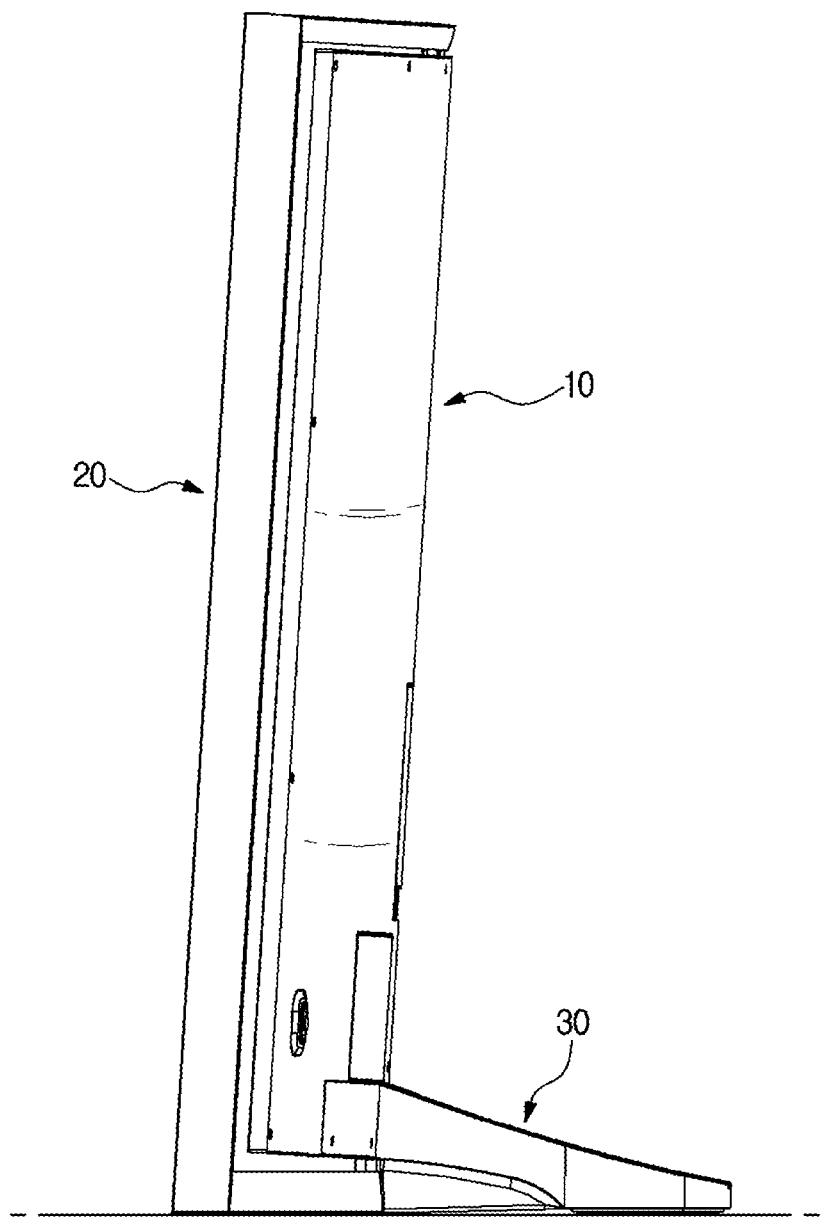
FIG. 3 is a side view which illustrates a display apparatus according to an exemplary embodiment.
Figure 4:
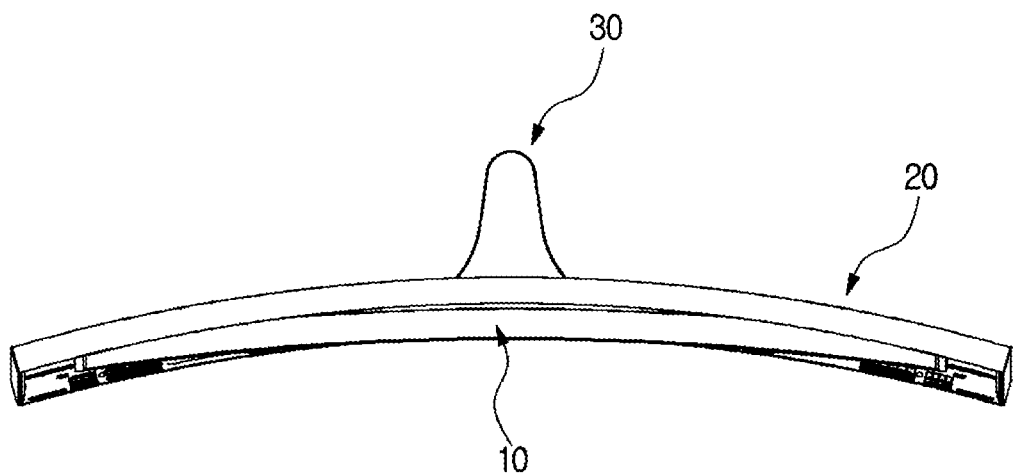
FIG. 4 is a plan view which illustrates a display apparatus according to an exemplary embodiment.

As shown in FIG. 3, a side view of the display apparatus 1 is illustrated, along with display 10, frame 20 and leg 30. As shown in FIG. 4, a plan view is illustrated which shows display 10, frame 20 and leg 30.

Figure 5:
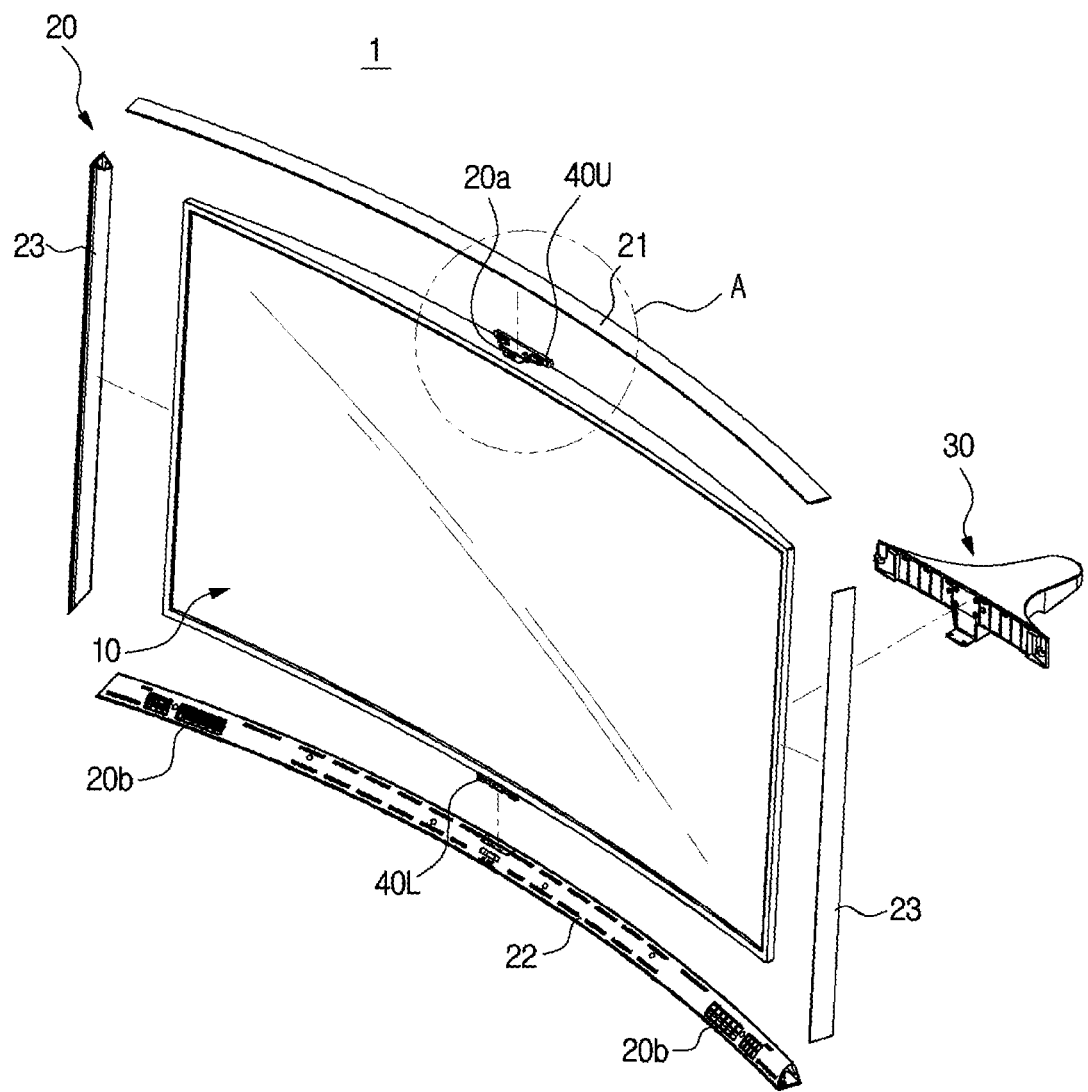
FIG. 5 is a front exploded view which illustrates a display apparatus according to an exemplary embodiment.
Figure 6:
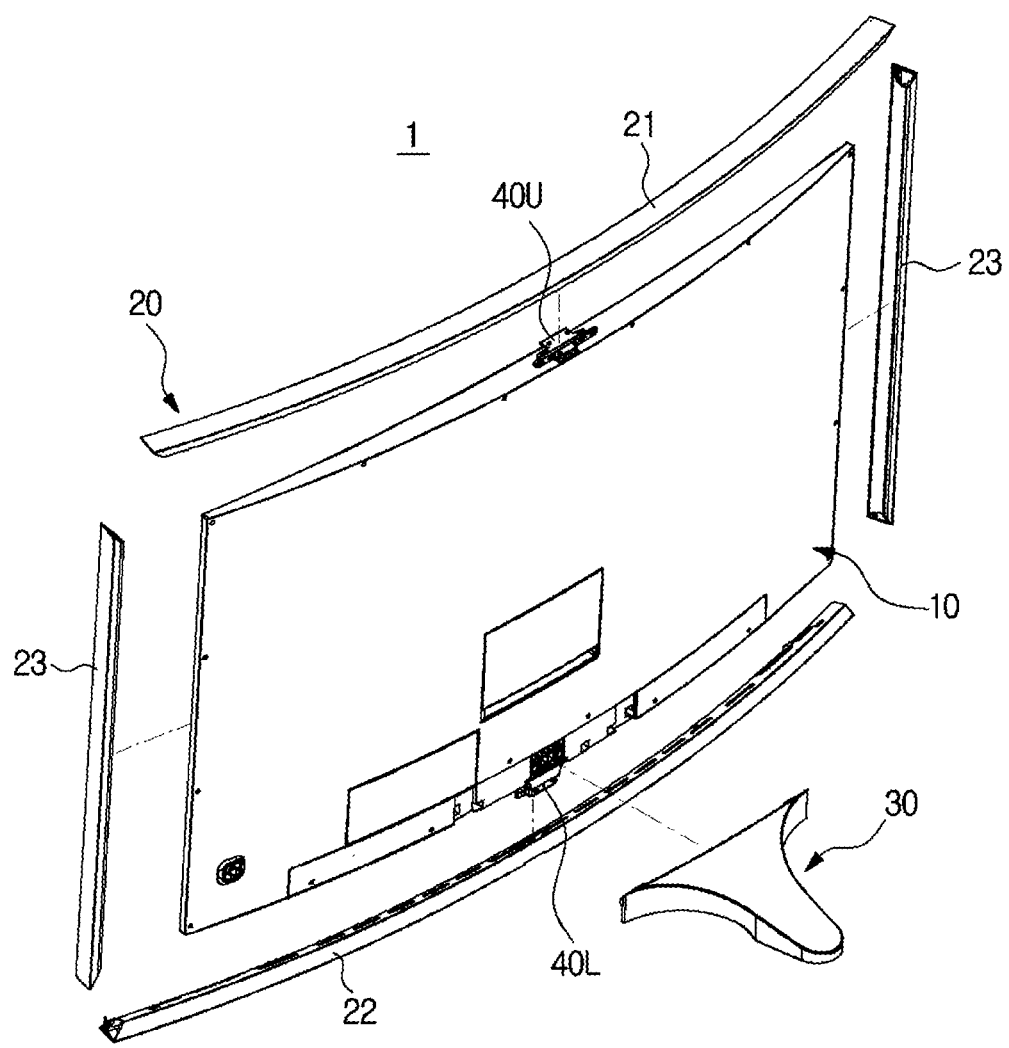
FIG. 6 is a rear exploded view which illustrates a display apparatus according to an exemplary embodiment.

As shown in FIGS. 5 and 6, the display 10 is curved such that both lateral ends thereof protrude forward relative to the central portion thereof. Thereby, the front and rear surfaces of the display 10 form curved surfaces.

Herein, the curvature of the front surface of the display 10 is smaller than the curvature of the rear surface. The thickness of the display 10 gradually decreases from the central portion to the lateral ends. This makes the display 10 look slim with both lateral ends of the display 10 formed to be thin and allows various printed circuit boards 150 (FIG. 7) for control of the display apparatus 1 to be accommodated in the interior of the central portion of the display.

The support frame 20 is formed in the shape of a quadrangular ring, thereby allowing the display 10 to be installed therein. Similar to the display 10, the support frame 20 is curved such that both lateral ends thereof protrude forward relative to the central portion thereof. Thereby, the support frame 20 has a shape which corresponds to that of the display 10. Accordingly, design integrity may be provided to the display apparatus 1.

The support frame 20 configured as above includes an upper frame 21 and a lower frame 22 which are spaced apart from each other in the vertical direction and extend in the horizontal direction, and a pair of side frames 23 extend in the vertical direction to connect the upper frame 21 and the lower frame 22 to each other at both ends thereof.

The side frames 23 are formed in the shape of a straight line, and each of the upper frame 21 and the lower frame 22 is curved such that both lateral ends thereof protrude forward relative to the central portion thereof. In this exemplary embodiment, the upper frame 21 and the lower frame 22 are curved with a curvature corresponding to the curvature of the rear surface of the display 10.

As shown in FIGS. 5 and 6, the leg 30 is fixed to at least one of the central portion of the lower end of the support frame 20 and the central portion of the lower end of display 10. The leg 30 extends rearward and is thus supported on the horizontal surface on which the display apparatus 1 is installed.

Accordingly, the display apparatus 1 is supported at three points on the horizontal surface by the both ends of the lower end of the support frame 20 and the leg 30, and therefore the display apparatus 1 may remain standing on the horizontal surface when installed. At this time, the display 10 and the support frame 20 may be installed at an incline through the leg 30 such that the upper ends thereof are inclined rearward to prevent the display 10 from falling down on the front surface thereof.

Figure 7:
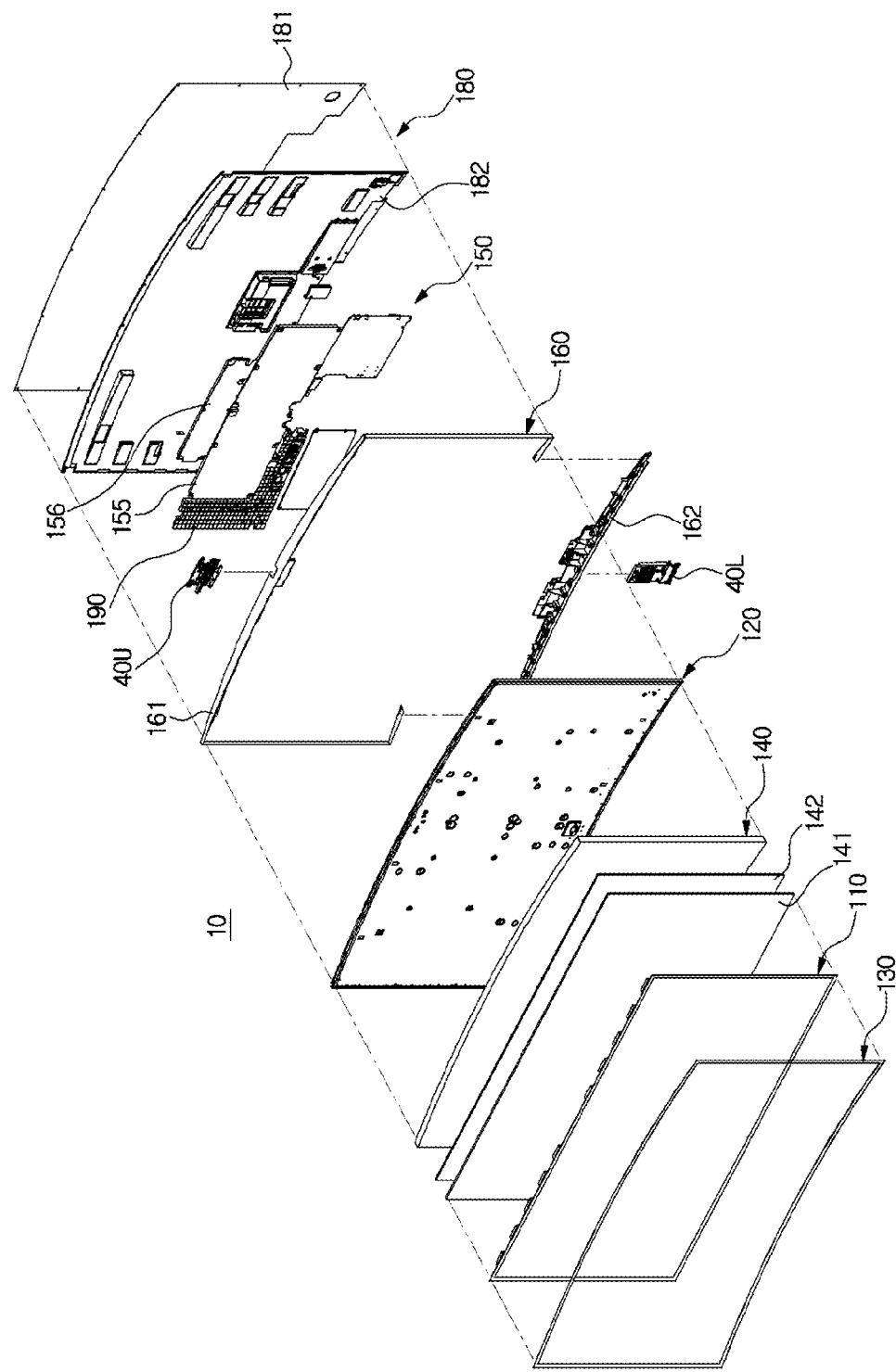
FIG. 7 is an exploded front perspective view which illustrates a display included in a display apparatus according to an exemplary embodiment.
Figure 8:
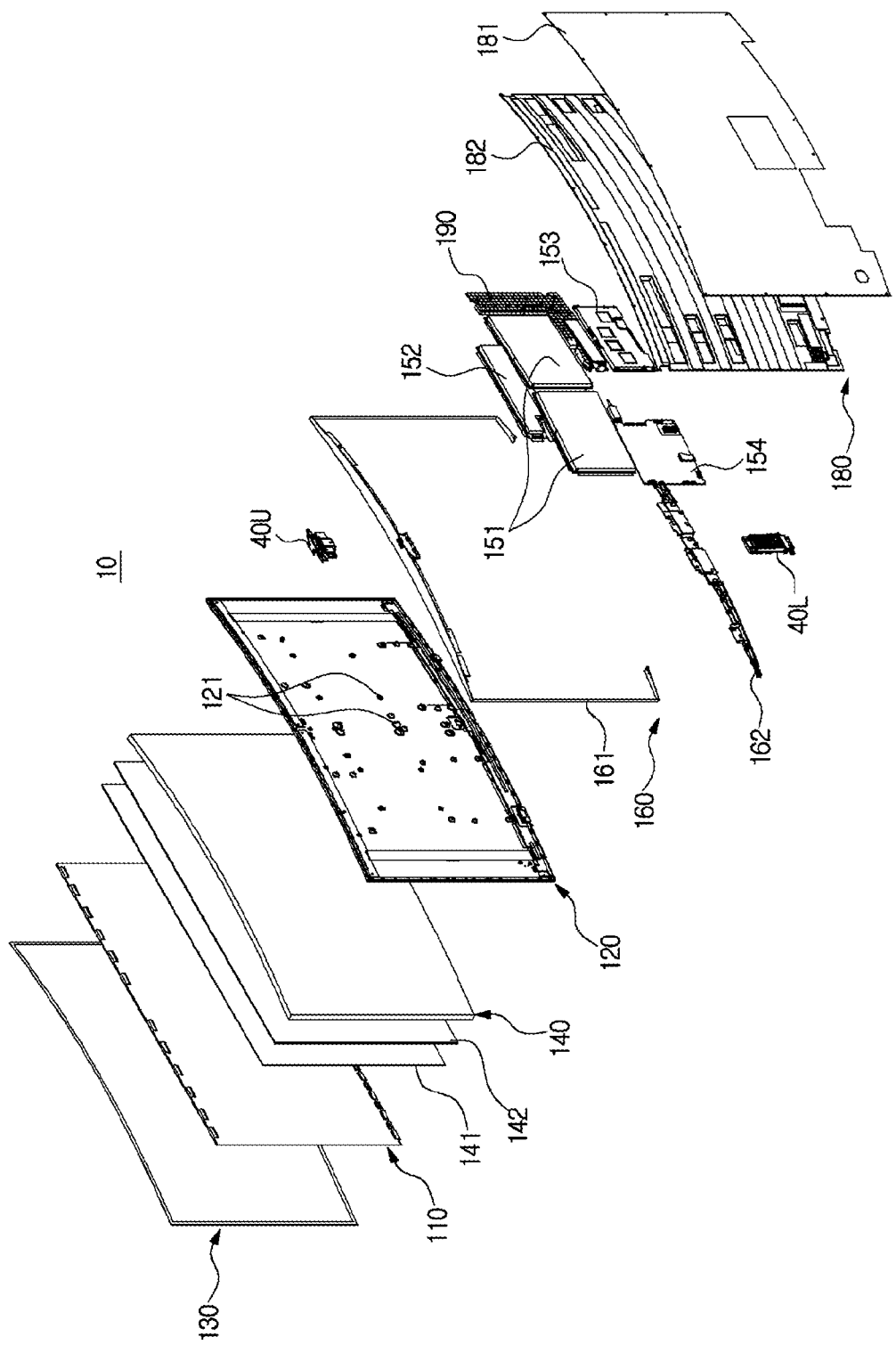
FIG. 8 is an exploded rear perspective view which illustrates a display included in a display apparatus according to an exemplary embodiment.

Referring to FIGS. 7 and 8, the display 10 includes a display panel 110 to display images, a bottom chassis 120 to support the rear surface of the display panel 110, and a top chassis 130 to cover the outer edges of the front surface of the display panel 110.

The display 10 further includes a side surface case 160 to define upper, lower, left and right sides of display 10 to cover the side surfaces of the display panel 110 and bottom chassis 120 and a rear surface case 180 coupled to the rear side of the bottom chassis 120 to define the rear surface of the display 10 and cover the rear surface of the bottom chassis 120 and the printed circuit boards 150, which will be described later. The external appearance is formed by the side surface case 160 and the rear surface case 180.

The display panel 110 is provided with an organic light emitting diode panel (not shown). Since the organic light emitting diode panel is formed in the shape of a flexible film, it may be easily bent.

The bottom chassis 120 is formed of a metallic plate and formed on the rear surface of the display 10. A reinforcement member 140 to enhance strength of the bottom chassis 120 is installed on the front surface of the bottom chassis 120, and the various printed circuit boards 150 to control operation of the display apparatus 1 are installed on the rear surface of the bottom chassis 120.

The reinforcement member 140 is provided with a honeycomb panel having a honeycomb structure formed therein in order to secure light weight and sufficient strength.

The top chassis 130 is formed in the shape of a quadrangular ring to support the outer edges of the front surface of the display panel 110 such that the display panel 110 is held installed in the bottom chassis 120.

Herein, the bottom chassis 120, top chassis 130 and reinforcement member 140, as described above, are formed in a curved shape, and the display panel 110 is formed in the shape of a flexible film to be easily bent is attached to the inner surface of the reinforcement member 140. Accordingly, in response to the display panel 110 being attached to the reinforcement member 140 formed in a curved shaped, it may be bent to have a shape which corresponds to the shapes of the bottom chassis 120 and the reinforcement member 140. That is, the display panel 110 is curved such that both lateral ends thereof protrude forward to correspond to the bottom chassis 120 and the reinforcement member 140.

In addition, disposed between the reinforcement member 140 and the display panel 110 are a heat dissipation sheet 141 formed of a material having a high thermal transmittance to allow heat produced in the display panel 110 to be distributed and dissipated within a short period of time, and an insulation sheet 142 formed of a thermally insulative material and disposed between the heat dissipation sheet 141 and the bottom chassis 120 to prevent rearward transfer of heat produced in the display panel 110. In this embodiment, the heat dissipation sheet 141 is provided with a graphite sheet, and the insulation sheet 142 is provided with a Poron® sheet.

The bottom chassis 120 and the reinforcement member 140 are formed in a curved shape such that both lateral ends thereof protrude forward, and the display panel 110 is formed in the shape of a flat panel. In response to the display panel 110 being supported by the bottom chassis 120 and the reinforcement member 140, the display panel 110 is deformed in a curved shape such that both lateral ends thereof protrude forward to correspond to the bottom chassis 120 and the reinforcement member 140.

The printed circuit boards 150 are flat panel-shaped substrates with various electric components mounted thereon. The printed circuit boards 150 include a power board 151 connected to an external power source to allow power to be supplied to the display apparatus 1, a panel drive board 152 to transfer the power to the display panel 110 to drive the display panel 110, a timing control board 153 to transfer an image signal to the display panel 110, and a signal processing board 154 to process various signals, such as an image signal and a sound signal.

The power board 151 is divided into two parts and disposed at both sides of the central portion of the bottom chassis 120. This allows power board 151 to correspond to the bottom chassis 120 formed in the shape of a curved surface. Thereby, the distance between the power board 151 and the rear surface of the bottom chassis 120 may be maintained to be equal to or shorter than a certain distance.

The panel drive board 152 is disposed at the center of the upper portion of the bottom chassis 120. The timing control board 153 is disposed at one side of the lower portion of the bottom chassis 120, and the signal processing board 154 is disposed at the other side of the lower portion of the bottom chassis 120.

In this embodiment, insulation sheets 155 and 156 are disposed at positions on the rear surface of the bottom chassis 120 corresponding to the power board 151 and panel drive board 152. Thereby, they may prevent electrical interference between the power board 151 and panel drive board 152 and the bottom chassis 120.

A sub-speaker 190 such as a woofer speaker is disposed at one side of the rear surface of the bottom chassis 120. In this exemplary embodiment, the sub-speaker 190 is formed in a L shape and has a thickness which gradually decreases as the sub-speaker 190 extends from the central portion of the bottom chassis 120 toward a lateral end of the bottom chassis 120, such that a portion of the sub-speaker 190 positioned closer to the central of the bottom chassis 120 is thicker than another portion of the sub-speaker 190 positioned closer to the lateral end of the bottom chassis 120.

Figure 9:
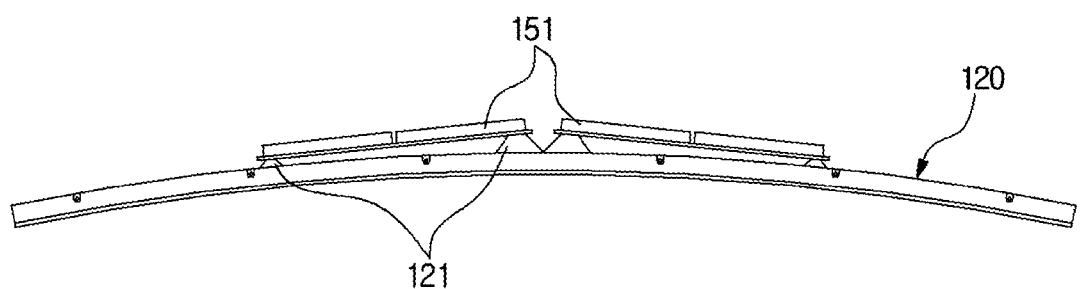
FIG. 9 is a plan view which illustrates studs formed at a bottom chassis of a display apparatus and a power board installed at the studs.

Referring to FIG. 9, the bottom chassis 120 is provided with studs 121 which allow the printed circuit boards 150 to be installed and spaced apart from the rear surface of the bottom chassis 120.

The studs 121 integrally protrude rearward from the bottom chassis 120. The printed circuit boards 150 are fixed to the tips of the studs 121 protruding rearward through, for example, screws such that the printed circuit boards 150 remain spaced apart from the rear surface of the bottom chassis 120 when fixed to the bottom chassis 120.

While the bottom chassis 120 is formed in the shape of a curved surface, the printed circuit boards 150 are formed in the shape of a flat panel. Accordingly, the studs 121 are provided with different heights depending upon positions to allow the printed circuit boards 150 having a flat panel shape to be installed at the bottom chassis 120 having the shape of a curved surface.

As described above, the central portion of the display 10 is thicker than both lateral ends of the display 10, and therefore studs 121 positioned closer to the center of the bottom chassis 120 are formed to be taller than other studs 121 positioned closer to the lateral ends of the bottom chassis 120 in order to allow the printed circuit boards 150 to be efficiently installed in the display 10. That is, the heights of the studs 121 gradually decrease from a position close to the center of the bottom chassis 120 to a position close to the lateral ends of the bottom chassis 120. In this exemplary embodiment, the studs 121 are disposed such that the heights thereof are symmetrically arranged on both sides of the central portion of the bottom chassis 120.

Figure 11:
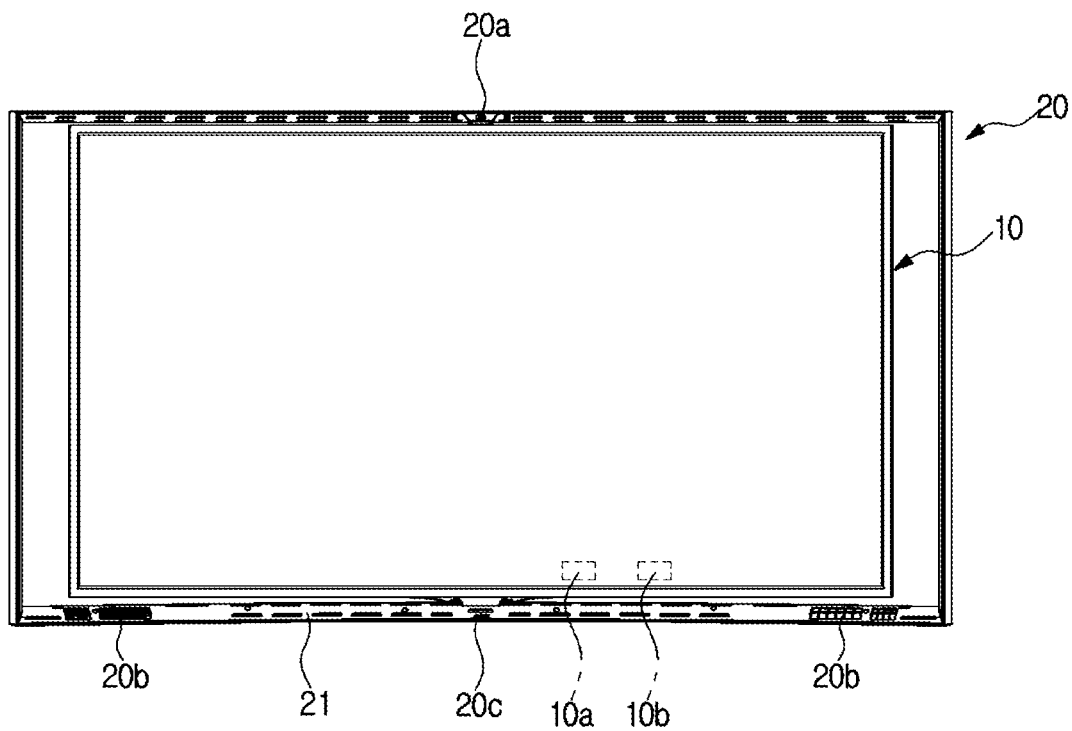
FIG. 11 is a front view which illustrates a display apparatus according to an exemplary embodiment.

In addition, as shown in FIG. 11, disposed at the lower portion of the display unit 10 are a Wi-Fi module 10*a* allowing the display apparatus 1 to be wirelessly connected to Internet and a Bluetooth® module 10*b* allowing the display apparatus 1 to be connected to external devices through Bluetooth®. In addition, a power button 10*c* (FIG. 2) to turn on/off power to the display apparatus 1 is disposed at one side of the rear surface of the display 10.

As shown in FIG. 7, the side surface case 160 is formed in the shape of a quadrangular ring and covers four side surfaces, i.e., upper, lower, left and right side surfaces of the display panel 110, the bottom chassis 120, and the constituents disposed between the display panel 110 and the bottom chassis 120. The side surface case 160 includes a first side surface case 161 formed of metal and having a upside down U-shape and a second side surface case 162 connecting the lower ends of the first side surface case 161. The first side surface case 161 is formed of metal, and the second side surface case 162 is formed of resin. This allows the Wi-Fi module 10*a* and the Bluetooth® module 10*b* installed in the display unit to conduct wireless communication with external devices through the second side surface case 162.

The rear surface case 180 includes a rear surface case member 181 formed of metal and defining the rear surface of the rear surface case 180 and a support plate 182 formed of resin and attached to the front surface of the rear surface case 181 member in order to maintain the rear surface case 181 member in a curved state with a certain curvature. An aluminum sheet (not shown) is attached to the rear surface of the rear surface case 181 member.

With the rear surface case 180 configured as above, the rear surface case 180 may be provided with sufficient strength through the support plate 182, while the aluminum sheet is attached to the rear surface of the rear surface case 180, i.e., the rear surface of the rear surface case 181 member.

The display 10 is connected to the support frame 20 through a pair of connection frames 40U and 40L, as shown in FIG. 7. In this exemplary embodiment, the display 10 is fixed to the support frame 20 through the connection frames 40U and 40L. The connection frames 40U and 40L include an upper connection frame 40U having an upper end connected to the central portion of the upper frame 21 and a lower end connected to the center of the upper end of the display 10, and a lower connection frame 40L having an upper end connected to the center of the lower end of the display 10 and a lower end connected to the central portion of the lower frame 22. Accordingly, the central portion of the upper end of the display 10 is connected to the central portion of the upper frame 21 through the upper connection frame 40U, and the central portion of the lower end of the display 10 is connected to the central portion of the lower frame 22 through the lower connection frame 40L.

Figure 10:
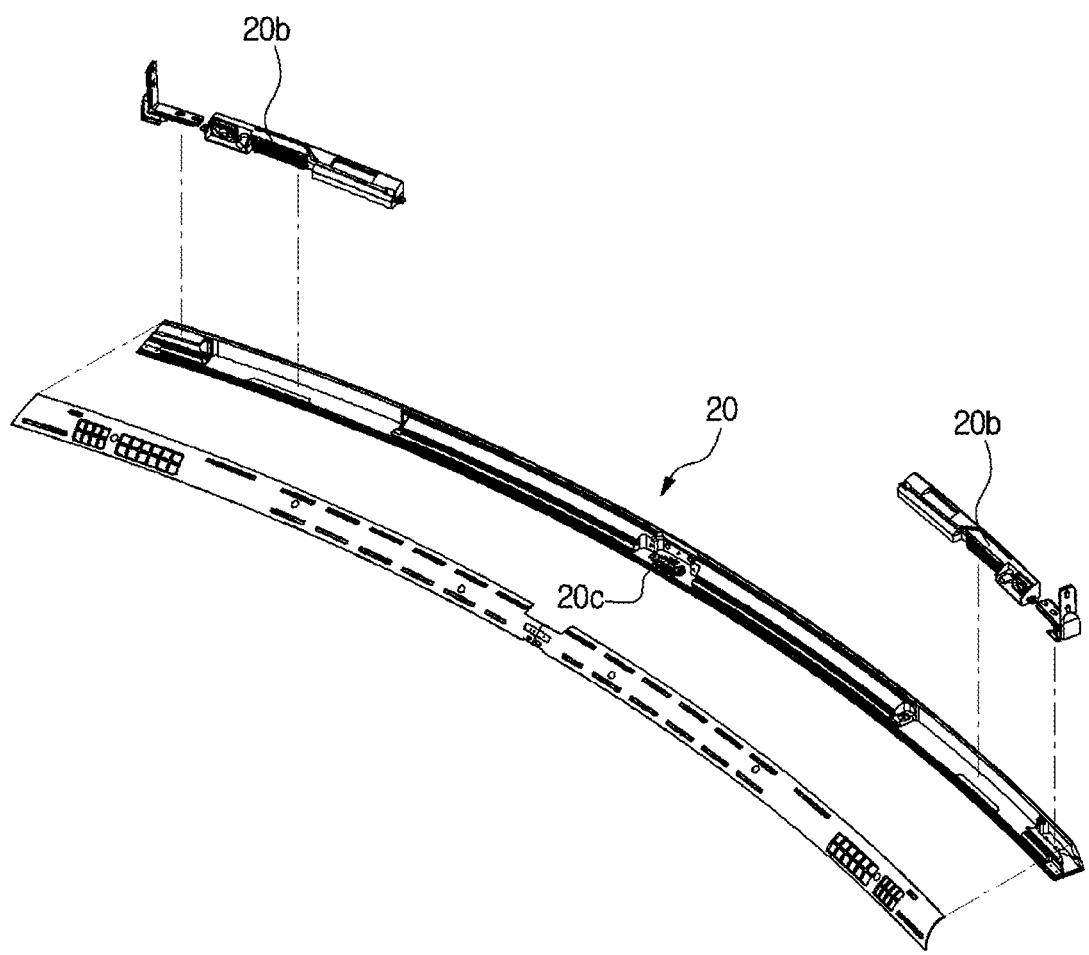
FIG. 10 is an exploded perspective view which illustrates a lower frame included in a display apparatus according to an exemplary embodiment.

A camera 20*a* (FIG. 12) allowing the user to use a video call function through the display apparatus 1 is disposed at the center of the upper portion of the support frame 20. Main speakers 20*b* (FIGS. 10 and 11) to receive a sound signal to generate sound are disposed at the lower portion of the support frame 20, i.e., at both sides of the lower frame 22, as shown in FIG. 11. In addition, an infrared receive module 20*c* serving to receive a signal from a remote controller is disposed at a position near the center of the lower frame 22.

Figure 12:
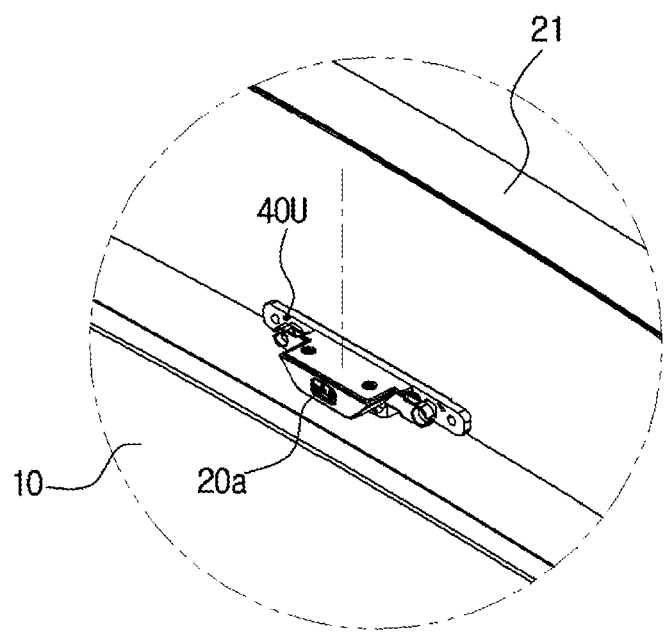
FIG. 12 is an enlarged view illustrating section 'A' shown in FIG. 5.

In this exemplary embodiment, as shown in FIG. 12, the camera 20*a* is fixed to the upper end of the upper connection frame 40U, and is thus fixed to the upper frame 21 when the upper end of the upper connection frame 40U is fixed to the upper frame 21.

A wire (not shown) connecting the camera 20*a* to the printed circuit boards 150 in the display 10 is installed at the upper connection frame 40U in a penetrating manner. In addition, a wire (not shown) connecting the main speakers 20*b* and the infrared receive module 20*c* to the printed circuit boards 150 in the display 10 is installed at the lower connection frame 40L in a penetrating manner. Thereby, power and signals may be transferred from the printed circuit boards 150 to the camera 20*a*, the main speakers 20*b* and the infrared receive module 20*c*.

While the power button 10*c*, the main speakers 20*b*, the sub-speaker 190, the infrared receive module 20*c*, the Bluetooth® module 10*b* and the Wi-Fi module 10*a* are illustrated as being installed at one of the display 10 and the support frame 20, the exemplary embodiments are not limited thereto. The aforementioned constituents may be selectively installed at one of the display 10 and the support frame 20 according to design or shape of the display apparatus 1.

The reinforcement member 140 of this exemplary embodiment is provided with a honeycomb panel to have light weight and sufficient rigidity, but exemplary embodiments are not limited thereto. The reinforcement member 140 may be provided with, for example, a heat spreader, which quickly distributes heat to serve as a heat dissipation member to quickly dissipate heat produced in the printed circuit boards 150. In addition, the reinforcement member 140 may be formed of an insulation material to serve as an insulation member to prevent heat produced in the printed circuit boards 150 from being transferred to the display panel 110.

While the display panel 110 is illustrated in an exemplary embodiment as being installed at the bottom chassis 120 through the reinforcement member 140, the exemplary embodiments are not limited thereto. The display panel 110 may be directly installed at the bottom chassis 120 without a constituent corresponding to the reinforcement member 140, as long as the bottom chassis 120 has a sufficient strength allowing the bottom chassis 120 to remain in a curved form and to support the display panel 110 such that the display panel 110 is curved.

While the display 10 is illustrated in this exemplary embodiment as being fixed to the support frame 20 through the connection frames 40U and 40L, the exemplary embodiments are not limited thereto. The display 10 may be installed in the 20 such that the display 10 rotates leftward or rightward.

In addition, the interior of the support frame 20 may be provided with a height greater than the height of the display 10 such that the display t 10 is vertically movable when installed in the support frame 20. Alternatively, the interior of the support frame 20 may be provided with a width greater than the width of the display 10 such that the display 10 is laterally movable when installed in the support frame 20.

In this exemplary embodiment, the rear surface of the display 10 is formed with a curvature equal to the curvature of the support frame 20 and the front surface of the display 10 has a lesser curvature than that of the rear surface of the display 10. However, the exemplary embodiments are not limited thereto. Various curvatures may be provided according to design of the display apparatus 1.

In this exemplary embodiment, the display panel 110 is provided with an organic light emitting diode panel which is easily bendable and thus bent in a curved shape when it is attached to the curved bottom chassis 120 or reinforcement member 140. However, the exemplary embodiments are not limited thereto. The display panel 110 may be formed by fabricating a liquid crystal display panel having a curved shape.

In this exemplary embodiment, studs 121 positioned closer to the center of the bottom chassis 120 are configured to be taller than other studs 121 positioned closer to the lateral ends of the bottom chassis 120. However, the exemplary embodiments are not limited thereto. In another exemplary embodiment, the studs 121 may be symmetrically formed about the central portion of the bottom chassis 120 such that studs 121 positioned closer to the center of the bottom chassis 120 are taller than other studs 121 positioned closer to the lateral ends of the bottom chassis 120.

While the support frame 20 is illustrated as being formed in a quadrangular shape in an exemplary embodiment, the exemplary embodiments are not limited thereto. The support frame 20 may be formed to have an upside down U-shape by omitting a constituent which corresponds to the lower frame 22.

While the side surface case 160 and the rear surface case 180 is illustrated as being separately provided to the display 10 in this exemplary embodiment, the exemplary embodiments are not limited thereto. The four side surfaces and rear surface of the display 10 may be implemented by a single case (not shown).

As is apparent from the above description, according to an exemplary embodiment, a display is supported at the inner side of a support frame which is curved to correspond to the shape of the display. Accordingly, a display apparatus may be provided with a support structure suitable for the display.

Although a few exemplary embodiments of the present invention have been shown and described, it would be appreciated by those skilled in the art that changes may be made to the embodiments without departing from the principles and spirit of the invention, the scope of which is defined in the claims and their equivalents.

What is claimed is:

1. A display apparatus comprising:
a display panel;
a bottom chassis configured to support the display panel and formed to be curved such that opposite sides of the bottom chassis protrude forward compared to a center thereof;
a printed circuit board disposed at a rear of the bottom chassis; and
a plurality of studs provided at a rear surface of the bottom chassis and connected to the printed circuit board so that the printed circuit board is spaced apart from the rear surface of the bottom chassis,
wherein the plurality of studs have different heights from the rear surface of the bottom chassis according to positions of the plurality of studs in a width direction of the bottom chassis, and
wherein studs, among the plurality of studs, positioned closer to the center of the bottom chassis are taller than other studs, among the plurality of studs, positioned closer to opposite lateral ends of the bottom chassis.

2. The display apparatus of claim 1, further comprising a case which covers the printed circuit board, wherein the case is formed to be curved such that opposite sides thereof protrude forward.

3. The display apparatus of claim 1, wherein the heights of the plurality of studs gradually decrease from a central portion of the bottom chassis to the opposite lateral ends of the bottom chassis.

4. The display apparatus of claim 1, wherein the plurality of studs are arranged such that the heights thereof are symmetrically provided relative to a central portion of the bottom chassis.

5. The display apparatus of claim 1, wherein the printed circuit board includes one of a power board which supplies power, a panel drive board which drives the display panel, a timing control board which transfers an image signal to the display panel, and a signal processing board which processes an image signal and a sound signal.

6. The display apparatus of claim 1, wherein the plurality of studs integrally protrude rearward from the bottom chassis.

7. The display apparatus of claim 1, wherein the studs are connected to the printed circuit board by screws.

8. A display apparatus comprising:
a display module of which opposite lateral side ends are curved to protrude forward compared to a center thereof; and
a printed circuit board disposed at a rear of the display module,
wherein the display module includes a plurality of studs provided at a rear surface thereof and connected to the one printed circuit board so that the printed circuit board is spaced apart from the rear surface of the display module, and
wherein the plurality of studs have different heights from the rear surface of the display module according to positions of the plurality of studs in a width direction of the display module, and
wherein studs, among the plurality of studs, positioned closer to the center of the display module are taller than other studs, among the plurality of studs, positioned closer to the opposite lateral ends of the display module.

9. The display apparatus of claim 8, wherein the heights of the plurality of studs gradually decrease from a central portion of the display module to the opposite lateral ends of the display module.

10. The display apparatus of claim 8, wherein the plurality of studs are arranged such that the heights thereof are symmetrically provided relative to a central portion of the display module.

11. The display apparatus of claim 8, wherein the printed circuit board includes one of a power board which supplies power, a panel drive board which drives the display panel, a timing control board which transfers an image signal to the display panel, and a signal processing board which processes an image signal and a sound signal.

12. The display apparatus of claim 8, wherein the plurality of studs integrally protrude rearward from the display module.

13. The display apparatus of claim 8, wherein the studs are connected to the printed circuit board by screws.

14. A display apparatus comprising:
a display panel;
a chassis formed to be curved such that opposite left and right side edges of the chassis are disposed forward compared to a central vertical region thereof, the chassis configured to support the display panel in a curved state;
a printed circuit board disposed at a rear of the chassis and has a first vertical side edge of the printed circuit board positioned closer to the central vertical region of the chassis is spaced a first distance from the display panel and a second vertical side edge of the printed circuit board opposite to the first side edge is spaced a second distance from the display panel, the second distance being less than the first distance; and a plurality of studs provided at the rear of the chassis and coupled to the printed circuit board so that the printed circuit board is installed to be spaced apart from the rear of the chassis.

15. The display apparatus of claim 14,
wherein studs, among the plurality of studs, positioned closer to the central vertical region of the chassis is taller than other studs, among the plurality of studs, positioned closer to one of the opposite left and right side edges of the chassis.

16. The display apparatus of claim 14,
wherein the display panel deformed to be curved by the chassis such that opposite left and right side edges of the display panel are disposed forward compared to a central vertical region thereof.

17. The display apparatus of claim 14,
wherein the printed circuit board is a power board which supplies power.

18. The display apparatus of claim 14,
wherein the plurality of studs integrally protrude rearward from the chassis.

19. The display apparatus of claim 14, wherein the studs are coupled to the printed circuit board by screws.

* * * * *